United States Patent [19]
Batra et al.

[11] Patent Number: 5,939,760
[45] Date of Patent: Aug. 17, 1999

[54] SRAM CELL EMPLOYING SUBSTANTIALLY VERTICALLY ELONGATED PULL-UP RESISTORS AND METHODS OF MAKING, AND RESISTOR CONSTRUCTIONS AND METHODS OF MAKING

[75] Inventors: Shubneesh Batra, Boise; Monte Manning, Kuna, both of Id.

[73] Assignee: Micron Technology, Inc., Boise, Id.

[21] Appl. No.: 09/049,290

[22] Filed: Mar. 26, 1998

Related U.S. Application Data

[60] Continuation of application No. 08/775,356, Jan. 3, 1997, Pat. No. 5,744,846, which is a division of application No. 08/568,173, Dec. 6, 1995, Pat. No. 5,683,930.

[51] Int. Cl.⁶ .................................................. H01L 29/76
[52] U.S. Cl. .................... 257/380; 257/379; 257/903; 438/238; 365/154
[58] Field of Search .................................. 257/370, 380, 257/903; 438/238, 384; 365/154

[56] References Cited

U.S. PATENT DOCUMENTS

| | | | |
|---|---|---|---|
| 4,567,609 | 1/1986 | Metcalf | 382/9 |
| 4,933,739 | 6/1990 | Harari | 357/55 |
| 4,951,112 | 8/1990 | Choi et al. | 257/380 |
| 4,990,998 | 2/1991 | Koike et al. | 257/380 |
| 5,023,727 | 6/1991 | Boyd et al. | 358/310 |
| 5,087,956 | 2/1992 | Ikeda et al. | 257/380 |
| 5,093,706 | 3/1992 | Mitsuhashi et al. | 257/380 |
| 5,159,430 | 10/1992 | Manning et al. | 257/380 |
| 5,241,206 | 8/1993 | Lee et al. | 257/380 |
| 5,262,352 | 11/1993 | Woo et al. | 437/189 |
| 5,308,782 | 5/1994 | Mazure et al. | 437/52 |
| 5,323,045 | 6/1994 | Murai | 257/380 |
| 5,398,200 | 3/1995 | Mazure et al. | 365/174 |
| 5,408,130 | 4/1995 | Woo et al. | 257/758 |
| 5,474,948 | 12/1995 | Yamazaki | 437/60 |
| 5,489,796 | 2/1996 | Harward | 257/379 |
| 5,570,311 | 10/1996 | Ema et al. | 365/154 |
| 5,705,843 | 1/1998 | Roberts | 257/379 |
| 5,744,846 | 4/1998 | Batra et al. | 257/380 |

*Primary Examiner*—Valencia Martin-Wallace
*Attorney, Agent, or Firm*—Wells, St. John, Roberts, Gregory & Matkins, P.S.

[57] ABSTRACT

A method of forming an SRAM cell includes, a) providing a pair of pull-down gates having associated transistor diffusion regions operatively adjacent thereto, one of the diffusion regions of each pull-down gate being electrically connected to the other pull-down gate; b) providing a pair of pull-up resistor nodes for electrical connection with a pair of respective pull-up resistors, the pull-up nodes being in respective electrical connection with one of the pull-down gate diffusion regions and the other pull-down gate; c) providing a first electrical insulating layer outwardly of the resistor nodes; d) providing a pair of contact openings, with respective widths, through the first insulating layer to the pair of resistor nodes; e) providing a second electrical insulating layer over the first layer and to within the pair of contact openings to a thickness which is less than one-half the open widths; f) anisotropically etching the second electrical insulating layer to define respective electrical insulating annulus spacers received within the respective pair of contact openings and a pair of elongated pull-up resistor openings laterally inward thereof; g) providing electrically conductive material within the pair of elongated pull-up resistor openings in electrical connection with the pair of pull-up resistor nodes to define the pull-up resistors; and h) providing a Vcc line in electrical connection with the pull-up resistors. SRAM circuitry produced according to the above method and by other methods are also contemplated.

22 Claims, 6 Drawing Sheets

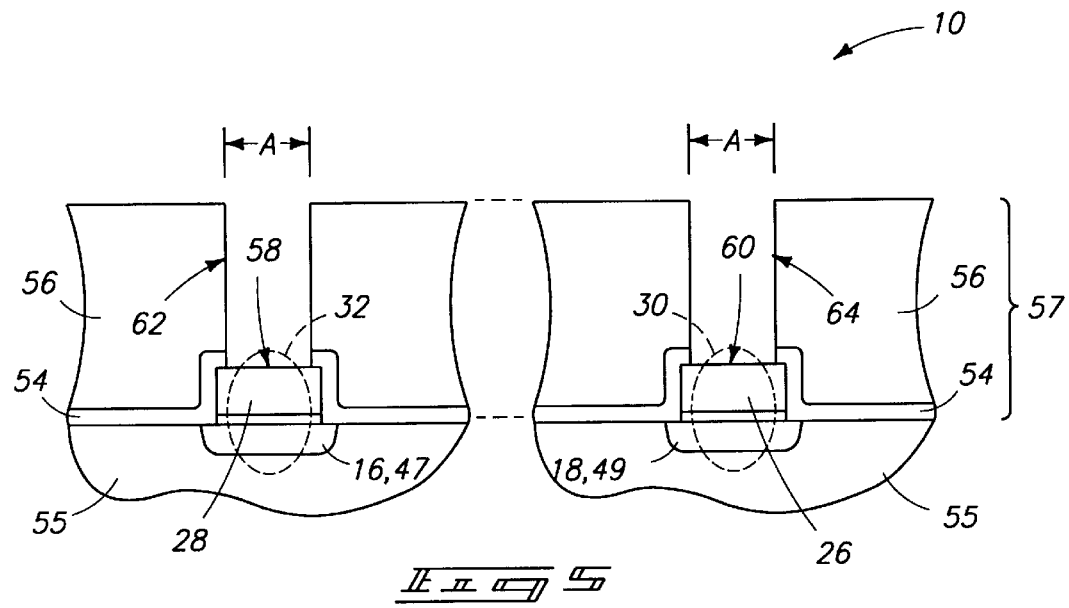
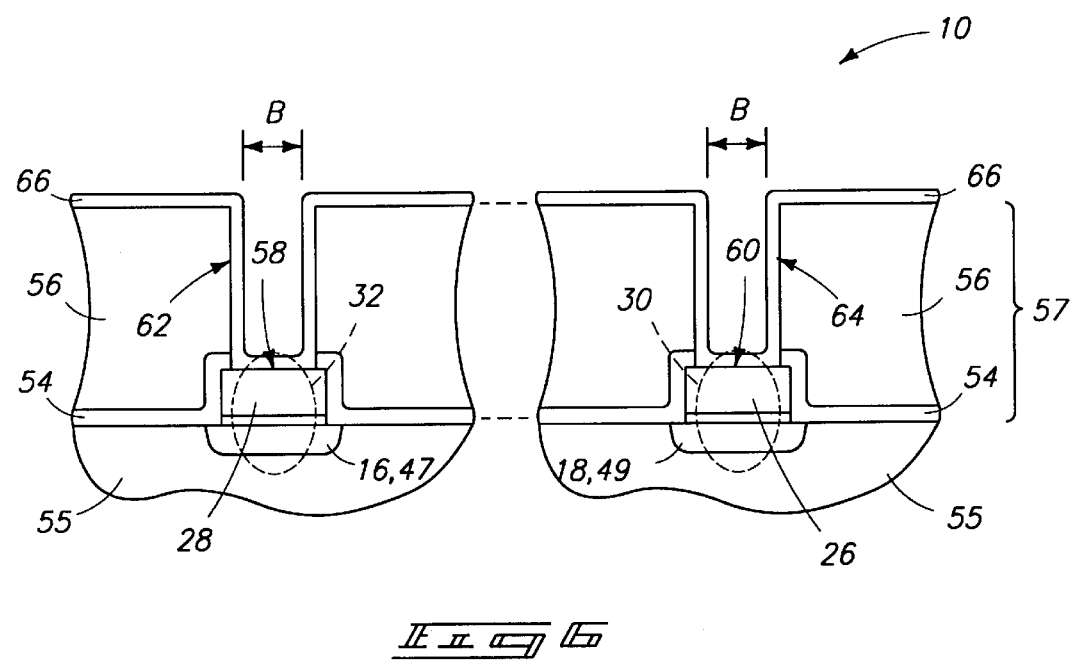

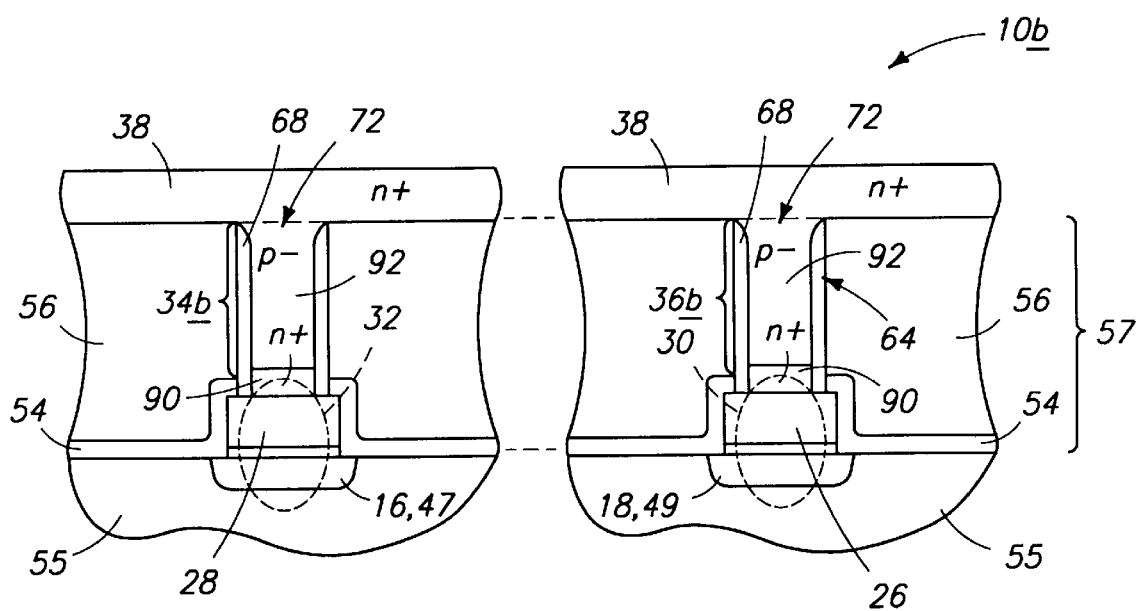

15,939,760

SRAM CELL EMPLOYING SUBSTANTIALLY VERTICALLY ELONGATED PULL-UP RESISTORS AND METHODS OF MAKING, AND RESISTOR CONSTRUCTIONS AND METHODS OF MAKING

This patent resulted from a continuation application of U.S. application Ser. No. 08/775,356, filed Jun. 3, 1997, now U.S. Pat. No. 5,744,846 which is a divisional application of U.S. application Ser. No. 08/568,173, filed Dec. 6, 1995 now U.S. Pat. No. 5,683,930.

TECHNICAL FIELD

This invention relates to SRAM cells employing vertically elongated pull-up diodes or resistors. The invention also relates to resistor and diode constructions.

BACKGROUND OF THE INVENTION

FIG. 1 shows a prior art six transistor static read/write memory cell 710 such as is typically used in high-density static random access memories (SRAMs). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

Static memory cell 710 generally comprises first and second inverters 712 and 714 which are cross-coupled to form a bistable flip-flop. Inverters 712 and 714 are formed by n-channel driver transistors 716 and 717, and p-channel load transistors 718 and 719. Driver transistors 716 and 717 are typically n-channel metal oxide silicon field effect transistors (MOSFETs) formed in an underlying silicon semiconductor substrate. P-channel transistors 718 and 719 are typically thin film transistors formed above the driver transistors.

The source regions of driver transistors 716 and 717 are tied to a low reference or circuit supply voltage, labelled $V_{ss}$ and typically referred to as "ground." Load transistors 718 and 719 are connected in series between a high reference or circuit supply voltage, labelled $V_{cc}$, and the drains of the corresponding driver transistors 716 and 717. The gates of load transistors 718 and 719 are connected to the gates of the corresponding driver transistors 716 and 717.

Inverter 712 has an inverter output 720 formed by the drain of driver transistor 716. Similarly, inverter 714 has an inverter output 722 formed by the drain of driver transistor 717. Inverter 712 has an inverter input 724 formed by the gate of driver transistor 716. Inverter 714 has an inverter input 726 formed by the gate of driver transistor 717.

The inputs and outputs of inverters 712 and 714 are cross-coupled to form a flip-flop having a pair of complementary two-state outputs. Specifically, inverter output 720 is cross-coupled to inverter input 726, and inverter output 722 is cross-coupled to inverter input 724. In this configuration, inverter outputs 720 and 722 form the complementary two-state outputs of the flip-flop.

A memory flip-flop such as that described typically forms one memory element of an integrated array of static memory elements. A plurality of access transistors, such as access transistors 730 and 732, are used to selectively address and access individual memory elements within the array. Access transistor 730 has one active terminal connected to cross-coupled inverter output 720. Access transistor 732 has one active terminal connected to cross-coupled inverter output 722. A plurality of complementary column line pairs, such as the single pair of complementary column lines 734 and 736 shown, are connected to the remaining active terminals of access transistors 730 and 732, respectively. A row line 738 is connected to the gates of access transistors 730 and 732.

Reading static memory cell 710 involves activating row line 738 to connect inverter outputs 720 and 722 to column lines 734 and 736. Writing to static memory cell 710 involves first placing selected complementary logic voltages on column lines 734 and 736, and then activating row line 738 to connect those logic voltages to inverter outputs 720 and 722. This forces the outputs to the selected logic voltages, which will be maintained as long as power is supplied to the memory cell, or until the memory cell is reprogrammed.

FIG. 2 shows an alternative four transistor, dual wordline, prior art static read/write memory cell 750 such as is typically used in highdensity static random access memories. Static memory cell 750 comprises n-channel pull-down (driver) transistors 780 and 782 having drains respectively connected to pull-up load elements or resistors 784 and 786. Transistors 780 and 782 are typically metal oxide silicon field effect transistors (MOSFETs) formed in an underlying silicon semiconductor substrate.

The source regions of transistors 780 and 782 are tied to a low reference or circuit supply voltage, labelled Vss and typically referred to as "ground." Resistors 784 and 786 are respectively connected in series between a high reference or circuit supply voltage, labelled $V_{cc}$, and the drains of the corresponding transistors 780 and 782. The drain of transistor 782 is connected to the gate of transistor 780 by line 776, and the drain of transistor 780 is connected to the gate of transistor 782 by line 774 to form a flip-flop having a pair of complementary two-state outputs.

A memory flip-flop, such as that described above in connection with FIG. 2, typically forms one memory element of an integrated array of static memory elements. A plurality of access transistors, such as access transistors 790 and 792, are used to selectively address and access individual memory elements within the array. Access transistor 790 has one active terminal connected to the drain of transistor 780. Access transistor 792 has one active terminal connected to the drain of transistor 782. A plurality of complementary column line pairs, such as the single pair of complementary column lines 752 and 754 shown, are connected to the remaining active terminals of access transistors 790 and 792, respectively. A row line 756 is connected to the gates of access transistors 790 and 792.

Reading static memory cell 750 involves activating row line 756 to connect outputs 768 and 772 to column lines 752 and 754. Writing to static memory cell 750 involves first placing selected complementary logic voltages on column lines 752 and 754, and then activating row line 756 to connect those logic voltages to outputs 768 and 772. This forces the outputs to the selected logic voltages, which will be maintained as long as power is supplied to the memory cell, or until the memory cell is reprogrammed.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the four or more transistors typically required in a static memory cell. Because of the significantly different architectural arrangements and functional requirements of static and dynamic memory cells and circuits, static memory design has developed along generally different paths than has the design of dynamic memories.

FIG. 3 illustrates a typical top view of a prior art layout of portions of the FIG. 2 SRAM schematic pertinent to this disclosure. Such an SRAM cell employs two Vcc lines which are labeled respectively as Vcc(A) and Vcc(B). Lines 790a and 792a constitute the gate or wordlines of access devices 790 and 792, respectively. The two shaded areas 784 and 786 comprise the described pull-up resistors which are substantially horizontally formed as shown within the SRAM cell. Such horizontal positioning consumes considerable area within an individual SRAM cell, thus countering a desired goal of maximizing circuit density. Other examples of such similarly situated resistors can be found in U.S. Pat. No. 4,178,674 to Liu et al. and U.S. Pat. No. 4,828,629 to Akeda et al. Vertically oriented pull-up resistor constructions in SRAM cells have been proposed, such as is disclosed in our U.S. Pat. No. 5,177,030.

This invention arose principally arose from concerns associated with fabrication of improved SRAMs employing vertically elongated pull-up resistors. However the artisan will appreciate applicability of the invention to resistor constructions in general, with the invention only being limited by the accompanying claims appropriately interpreted with the Doctrine Of Equivalents.

BRIEF DESCRIPTION OF THE DRAWINGS

Preferred embodiments of the invention are described below with reference to the following accompanying drawings.

FIG. 5 is a diagrammatic and fragmentary sectional view of pertinent portions of an SRAM cell in accordance with the invention.

FIG. 6 is a view of the FIG. 5 wafer fragment at a processing step subsequent to that shown by FIG. 5.

FIG. 11 is another alternate view of the FIG. 5 wafer fragment at an another alternate processing step subsequent to that shown by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming an SRAM cell comprises the following steps:

providing a pair of pull-down gates having associated transistor diffusion regions operatively adjacent thereto, one of the diffusion regions of each pull-down gate being electrically connected to the other pull-down gate;

providing a pair of pull-up resistor nodes for electrical connection with a pair of respective pull-up resistors, the pull-up nodes being in respective electrical connection with one of the pull-down gate diffusion regions and the other pull-down gate;

providing a first electrical insulating layer outwardly of the pull-up resistor nodes;

providing a pair of contact openings through the first insulating layer to the pair of pull-up resistor nodes, the contact openings having respective open widths;

providing a second electrical insulating layer over the first layer and to within the pair of contact openings to a thickness which is less than one-half the open widths to less than completely fill the pair of contact openings;

anisotropically etching the second electrical insulating layer to define respective electrical insulating annulus spacers received within the respective pair of contact openings and a pair of elongated pull-up resistor openings laterally inward thereof;

providing electrically conductive material within the pair of elongated pull-up resistor openings in electrical connection with the pair of pull-up resistor nodes to define the pull-up resistors; and providing a Vcc line in electrical connection with the pull-up resistors.

In accordance with another aspect of the invention, an SRAM cell comprises:

at least one pull-down gate, a ground line, a Vcc line, and at least one pull-up resistor; the pull-down gate having associated transistor diffusion regions operatively adjacent thereto;

the Vcc line being provided elevationally outward relative to the transistor diffusion regions, an electrical insulating layer being provided intermediate the Vcc line and transistor diffusion regions; and the pull-up resistor being substantially vertically elongated between Vcc and a selected of the transistor diffusion regions adjacent the pull-down gate through a substantially vertically elongated passageway formed through the insulating layer, the passageway comprising a combination of a previously formed contact opening through the insulating layer and an electrical insulating annulus spacer received laterally inward therewithin.

Figure 1:
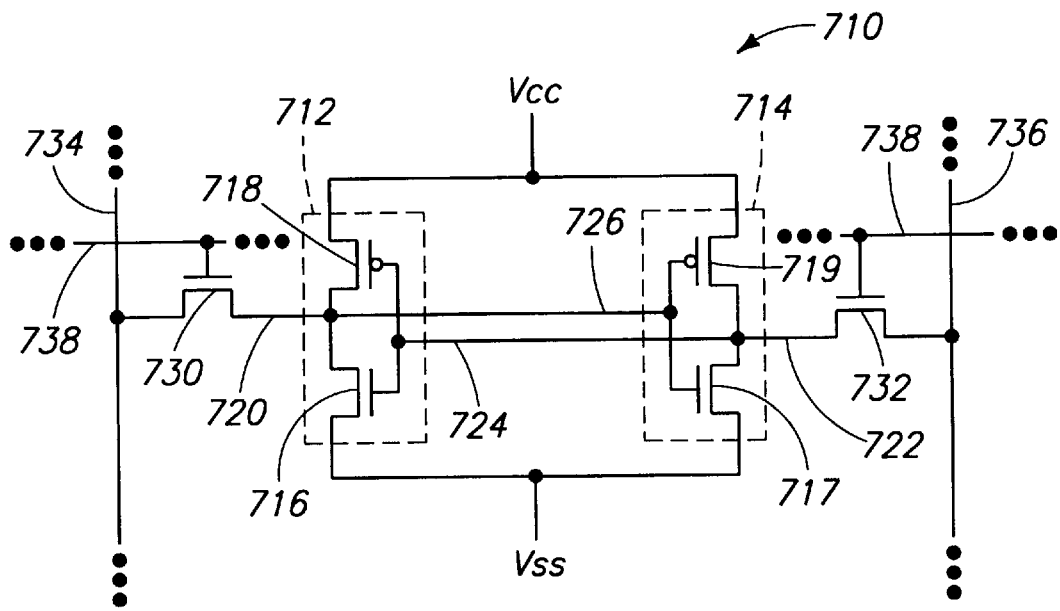
FIG. 1 is a schematic of a prior art SRAM cell.
Figure 2:
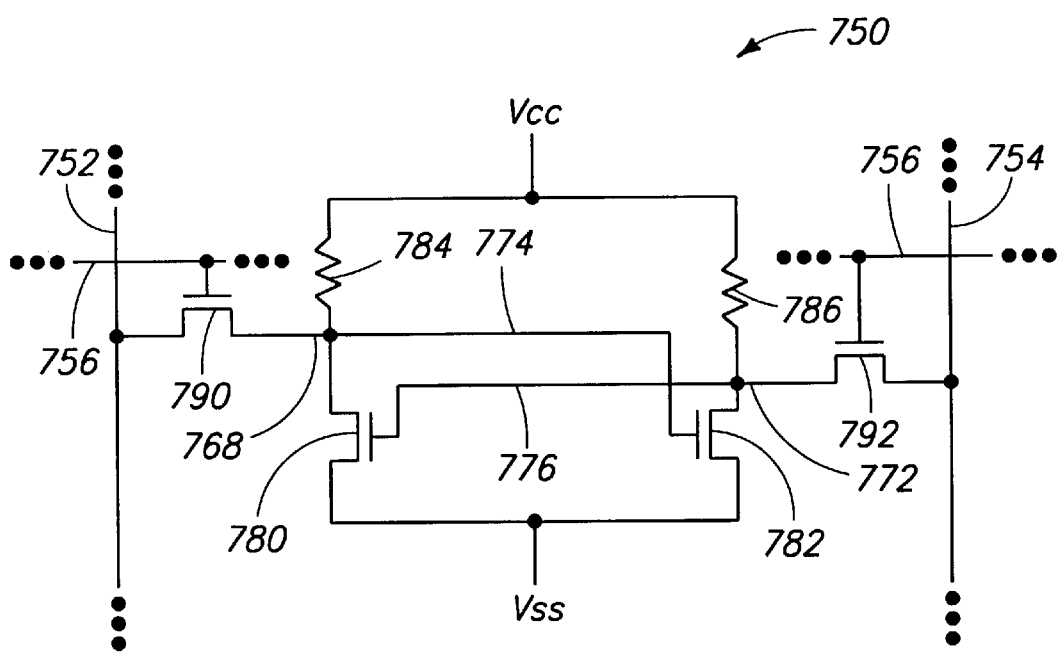
FIG. 2 is an alternate schematic of an alternate prior art SRAM cell.
Figure 3:
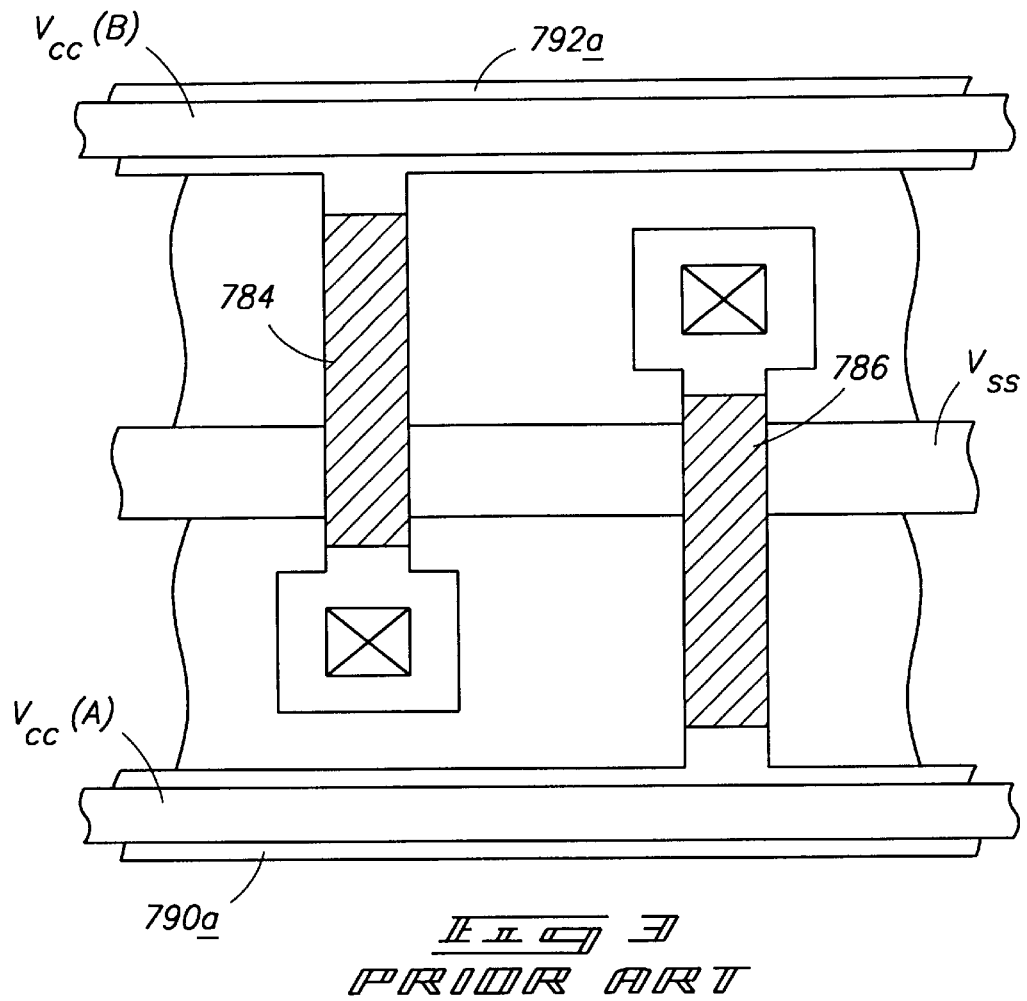
FIG. 3 is a diagrammatic top layout view of portions of a prior art SRAM cell.
Figure 4:
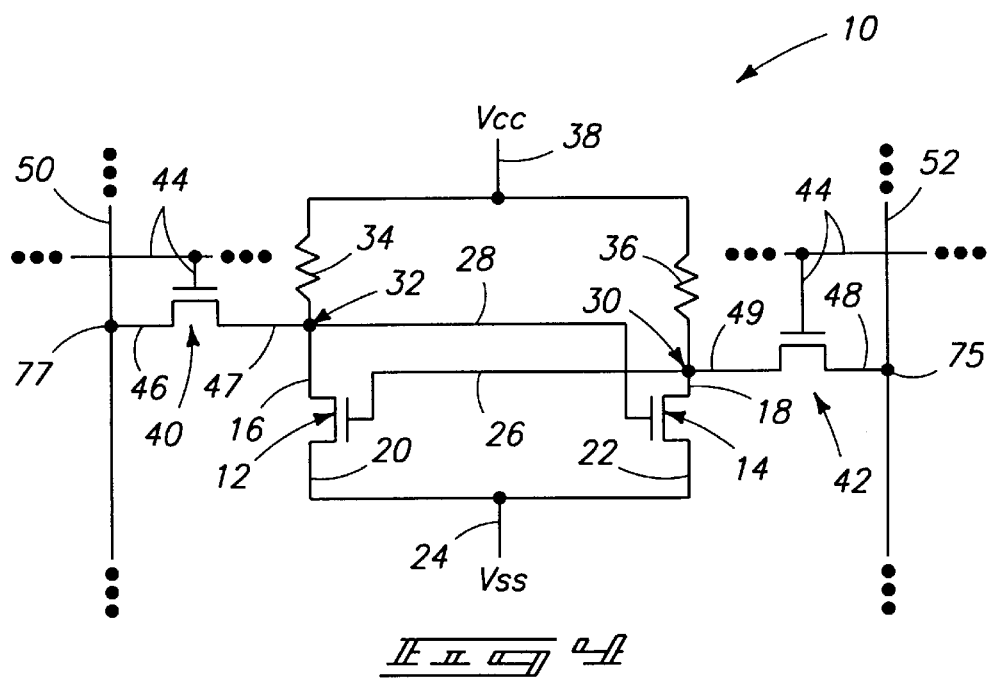
FIG. 4 is a schematic representation of one SRAM cell in accordance with the invention.

Referring initially to FIG. 4, an SRAM cell schematic is indicated generally with reference numeral 10. Such is essentially the same as the FIG. 2 schematic, comprising pull-down transistors 12 and 14 having associated transistor drain and source diffusion regions 16, 18 and 20, 22 respectively. Source diffusion regions 20 and 22 of pull-down transistors 12 and 14, respectively, are tied to a low reference or circuit supply voltage Vss 24 typically referred to as ground. Pull-down devices 12 and 14 include respective gate lines 26 and 28 which cross-couple to the drain diffusion regions 18, 16, respectively, of the opposing pull-down device 14, 12 respectively, at node locations 30 and 32, respectively. Pull-up resistors 34 and 36 are effectively electrically connected to drain diffusion regions 16 and 18 of pull-down devices 12 and 14, respectively, and cross-coupled gates 28 and 26 at pull-up resistor node locations 32 and 30, respectively. Load resistors 34 and 36 are connected in series between a high reference or circuit supply voltage 38, indicated as Vcc.

A pair of access transistors 40 and 42 are provided to selectively address and access individual memory elements within the array. Access devices 40 and 42 comprise row or wordline gates 44, and associated active diffusion region terminals 46, 47 and 48, 49, respectively. Regions 47 and 49 ohmically connect with nodes 32 and 30, respectively, and thus the drain diffusion regions 16, 18 of pull-down devices 12, 14, respectively, and gates 28, 26 of pull-down devices 14, 12, respectively. Column lines 50 and 52 connect with active terminals 46 and 48 of access devices 40 and 42 and nodes 77 and 75, respectively.

Thus in a preferred embodiment, SRAM cells having at least four field effect transistors 12, 14, 40 and 42 comprises a pair of memory cell wordlines 44, a pair of pull-down gates 26, 28, a ground line 24, a Vcc line 38 and a pair of pull-up resistors 34 and 36. Wordlines 44 and pull-down gates 26 and 28 have associated transistor diffusion regions 46, 47, 48, 49 and 16, 20, 18 and 22, respectively.

Reading static memory cell 10 involves activating wordlines 44 to connect outputs 32 and 30 to column lines 50 and 52, respectively. Writing to static memory cell 10 involves first placing selected complementary logic voltages on column lines 50 and 52, and then activating wordlines 44 to connect those logic voltages to outputs 32 and 30. This forces the outputs to the selected logic voltages, which will be maintained as long as power is supplied to the memory cell, or until the memory cell is reprogrammed.

Reference is now initially made to FIGS. 5–8 for one embodiment preferred process depicting wafer fragment sectional views in forming an SRAM cell in accordance with the invention. SRAM cell 10 is illustrated in FIG. 5 as being fabricated relative to a semiconductor wafer/bulk substrate 55. An electrical insulating layer 54 is provided outwardly of bulk substrate 55 and over pull-down gates 28 and 26. An example and preferred material of composition for layer 54 is undoped $SiO_2$ deposited by decomposition of tetraethylorthosilicate (TEOS), with an example thickness being 3000 Angstroms. An undoped initial electrical insulating layer is preferred here to act as a shield to dopant diffusion relative to substrate active areas not depicted in FIG. 5.

Subsequently, an overlying electrical insulating layer 56 is provided over layer 54 to an example thickness of 14,000 Angstroms. An example and preferred material for layer 56 is borophosphosilicate glass (BPSG). Collectively in the context of the invention, layers 54 and 56 comprise an example first electrical insulating layer 57. As illustrated, diffusion regions 16, 47 and 18, 49 are received beneath extensions of gate lines 28 and 26, respectively. The phantom line circles 32 and 30 accordingly comprise the pair of pull-up resistor nodes of FIG. 4. Pulldown gates 28, 26 comprise respective top surfaces 58 and 60. Thus, pull-up resistor nodes 32 and 30 comprise pull-down gate top surfaces 58 and 60 respectively. And, first electrical insulating layer 57 is provided outwardly relative to pull-up resistor nodes 32 and 30. A pair of contact openings 62 and 64 are provided through first insulating layer 57 to pull-down gate top surfaces 58 and 60, respectively, and accordingly to pull-up resistor nodes 32 and 30, respectively. Contact openings 62 and 64 have a respective open width "A".

Referring to FIG. 6, a second electrical insulating layer 66 is provided over first layer 57 and to within pair of contact openings 62 and 64 to a thickness which is less than one-half open width "A" to less than completely fill pair of contact openings 62 and 64. Thus, second contact openings are provided within and relative the first contact openings 62 and 64. Preferably, first contact openings 62 and 64 are patterned to have the minimum available photolithographic feature size, with thus the secondary contact openings having a width "B" which is less than the minimum available photolithographic feature size.

An example and preferred material for layer 66 is undoped $SiO_2$ deposited by decomposition of TEOS. Thus in the preferred embodiment, second insulating layer 66 is different in predominant composition from first layer 57. Although in the preferred embodiment layer 66 is essentially the same in composition as insulative layer 54, layer 66 is different in predominant composition with respect to first insulating layer 57, which predominantly comprises BPSG of layer 56. An alternate material for layer 66 would be an insulative nitride, such as $Si_3N_4$. A preferred reason for having layer 66 constitute a different material from layer 56 is to prevent cross-diffusion of dopants between layers 56 and material subsequently provided inwardly of layer 66 within contact openings 62 and 64. Where such shielding of cross-diffusion is not particularly desired, first insulating layer 57 and second insulating layer 66 can be of the same predominant compositions.

Figure 7:
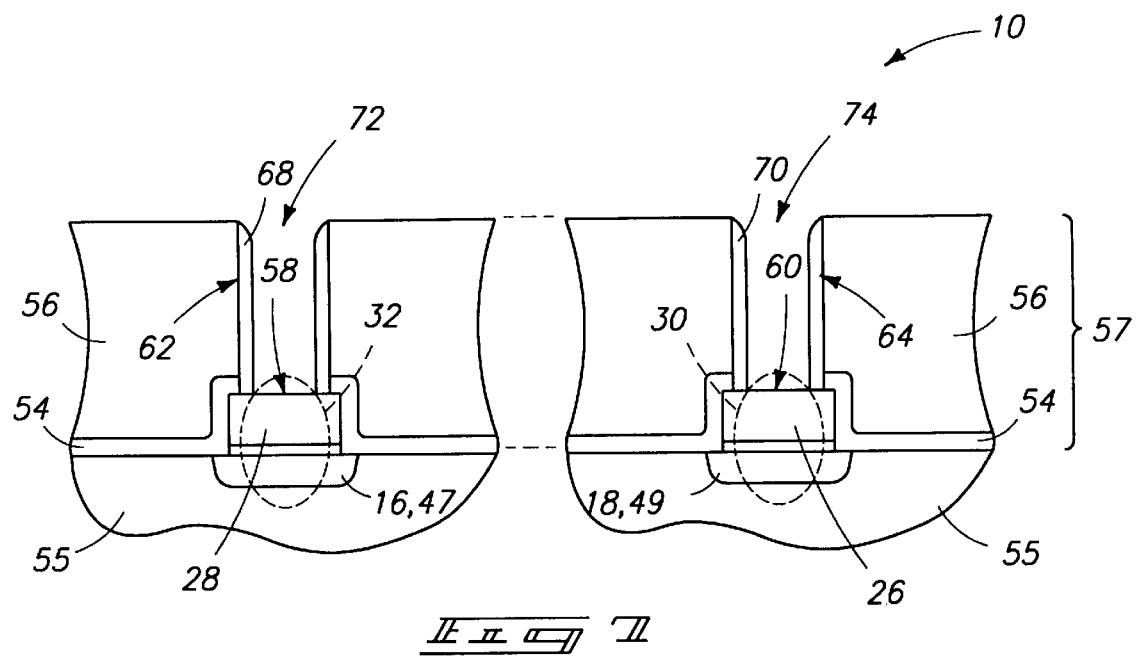
FIG. 7 is a view of the FIG. 5 wafer fragment at a processing step subsequent to that shown by FIG. 6.
Figure 8:
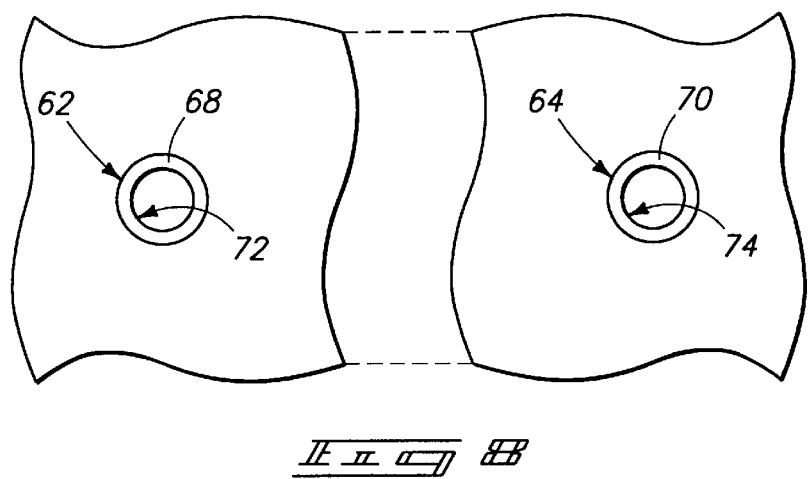
FIG. 8 is a diagrammatic top view of FIG. 7.

Referring to FIGS. 7 and 8, second electrical insulating layer 66 is anisotropically etched to define respective electrical insulating annulus spacers 68 and 70 received within the respective pair of contact openings 62 and 64, and effectively define a pair of elongated pull-up resistor openings 72 and 74 laterally inward thereof.

Figure 9:
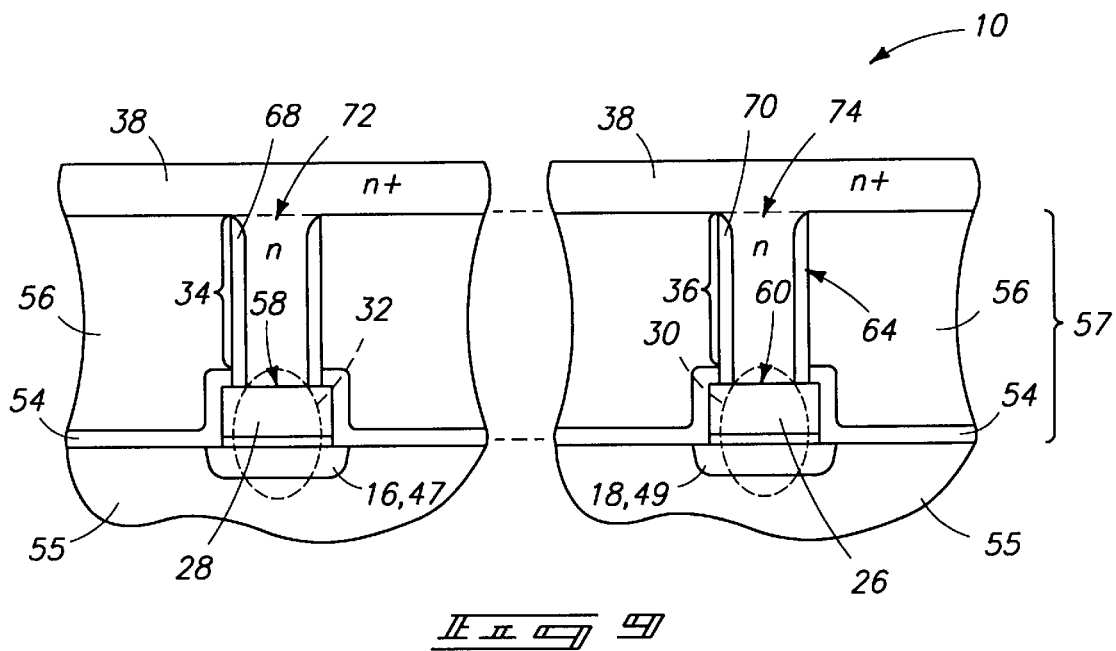
FIG. 9 is a view of the FIG. 5 wafer fragment at a processing step subsequent to that shown by FIG. 7.

Referring to FIG. 9, electrically conductive material is provided within the pair of elongated pull-up resistor openings 72 and 74 in electrical connection with the pair of pull-up resistor nodes 32 and 30, respectively, comprising top gate surfaces 58 and 60 respectively, thus defining the pair of substantially vertically elongated pull-up resistors 34 and 36, respectively. Vcc line 38 is provided outwardly of and in electrical connection with pull-up resistors 34 and 36. Thus, Vcc line 38 is provided elevationally outward relative to the FIG. 4 transistor diffusion regions, with an electrical insulating layer 57 being provided intermediate Vcc line 38 and such diffusion regions. Pull-up resistors 34 and 36 are substantially vertically elongated between Vcc line 38 and selected of the respective pull-down gates through a substantially vertically elongated passageway formed through insulating layer 57. Such passageway comprises a combination of previously formed contact openings 62 and 64 and electrical insulating annulus spacers 68 and 70, respectively, received laterally inward therewithin.

Several alternate manners are contemplated for providing electrically conductive material within pull-up resistor openings 72 and 74 and for subsequently providing Vcc line 38, with the invention only being limited by the accompanying claims appropriately interpreted in accordance with the doctrine of equivalents. Several preferred embodiment examples are described below.

First with reference to FIG. 9, the material from which resistors 34, 36 and Vcc line is provided can be from a common deposited layer of semiconductive material. Such material could be deposited to be suitably conductively "n−" doped in situ as-deposited. Subsequently, that portion of the semiconductive material layer received outwardly of the contact opening over first insulative material layer 57 could be ion implanted or otherwise conductively doped to provide an n+ concentration. That portion received outwardly of insulating layer 57 would subsequently be patterned into SRAM Vcc line 38 which would be commonly connected to pull-up resistors 34 and 36. Thus in this example, that portion of the semiconductive material layer received within the contact openings is electrically conductive to a lower first degree as compared to that portion of the semiconductive material layer comprising layer 38 outwardly of the contact openings. Thus, layer 38 comprises a higher conductivity line than regions 34 and 36, which effectively form pull-up resistors. The artisan will appreciate that various dopant concentrations can be utilized for the material of resistors 34 and 36 to provide the desired resistance to current flow.

Alternately where pull-down gates 28 and 26 comprise polysilicon which is heavily conductively doped with n-type material, out-diffusion from such gates might be sufficient or effective to form desired doped resistor regions 34 and 36 without or with lighter in-situ doping of the deposited layer. Further, out-diffusion of phosphorus (an n-type material) from BPSG layer 56 might be sufficiently effective to autodope Vcc line 38.

Figure 10:
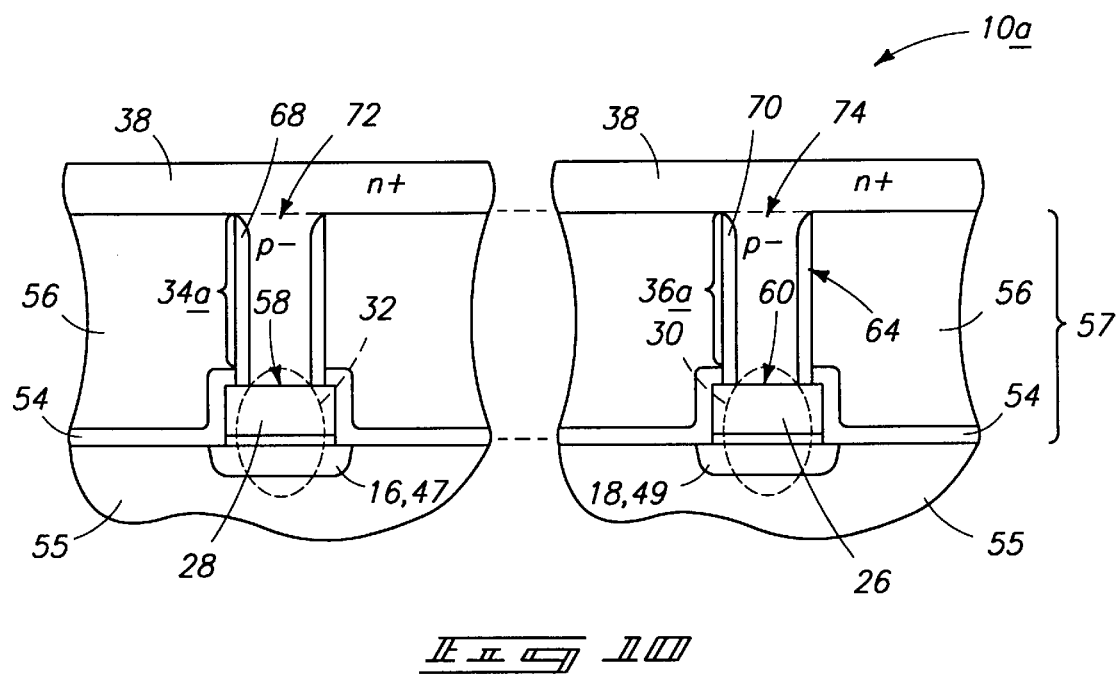
FIG. 10 is an alternate view of the FIG. 5 wafer fragment at an alternate processing step subsequent to that shown by FIG. 7.

An alternate construction is described with reference to FIG. 10, where a wafer fragment 10a is shown. Like numerals from the first described embodiment are utilized where appropriate with differences being indicated by the suffix "a". FIG. 10 illustrates an alternate embodiment whereby pull-up resistors 34 and 36 of FIG. 4 comprise diode constructions 34a and 36a. In the context of this document, the term "resistor" is intended to be generic to intrinsic resistor constructions as well as to diode constructions. Diode constructions of the invention would also inherently and effectively produce current resistance, thus functioning as resistors in the literal sense as well as providing a directed diode current flow function.

Pull-up resistors 34a and 36a of FIG. 10 are shown as comprising p-type material, thus forming diode constructions. Such could be formed by in situ depositing polysilicon to the p− doping. The different composition of annular spacers 68 and 70 from BPSG layer 56 will desirably prevent out-diffusion of the n-type dopant materials inherent in BPSG. Vcc line would then be n-type doped subsequently as described above.

Yet another alternate described embodiment wafer fragment 10b is described with reference to FIG. 11. Like numerals from the first described embodiment are utilized where appropriate, with differences being indicated by the suffix "b". Here, a back-to-back diode construction is provided as pull-up resistors 34b and 36b. As shown, those portions 90 of the semiconductive material within contact openings 72 and 74 which are closest to the respective nodes 32 and 30 are provided with a conductivity enhancing impurity of a first type, which in this example is n+ material. Those portions 92 received within contact openings 72 and 74 which are intermediate first portions 90 and Vcc line 38 are provided with a conductivity enhancing impurity of a second type, which in this example is p-material.

Thus, a back-to-back diode construction is formed. Such is preferably fabricated as described immediately above with respect to the FIG. 10 embodiment, with n+ regions 90 being formed by effective out-diffusion of n-type material from pull-down gates 28 and 26. Such out-diffusion in FIG. 11 would be restricted with respect to producing the FIG. 10 embodiment where back-to-back diode constructions are not desired.

The artisan will appreciate various modifications in construction and method of the above described preferred embodiments. By way of example only, the above resistor constructions might comprise undoped material. Further, SRAM constructions are contemplated having less than two pull-up resistors. Also, resistor and more narrowly diode constructions are contemplated outside of SRAM cell circuitry.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An SRAM cell comprising:

at least one pull-down gate, a Vcc line, and at least one pull-up resistor;

the Vcc line being provided elevationally outward relative to the pull down gate, an electrical insulating layer being provided intermediate the Vcc line and the pull-down gate; and the pull-up resistor being substantially vertically elongated between the Vcc line and the pull-down gate through a substantially vertically elongated passageway formed through the insulating layer, the passageway comprising a combination of a contact opening extending through a first insulating layer and an electrical insulating annulus spacer received laterally inward within the contact opening, the annulus spacer comprising a different material than the first insulating layer.

2. The SRAM cell of claim 1 wherein the pull-down gate has a top surface, and further comprising:

the pull-up resistor being against the top surface of the pull down gate;

the pull-down gate top surface comprising a first lateral width and the pull-up resistor comprising a second lateral width at a location where the pull up resistor is against the pull-down gate top surface; and the second lateral width being less than the first lateral width.

3. The SRAM cell of claim 2 wherein the pull-up resistor has a vertical length and comprises the second lateral width along an entirety of its length.

4. An SRAM cell comprising:
at least one pull-down gate, a Vcc line, and at least one pull-up resistor; the Vcc line being provided elevationally outward relative to the pull down gate;
an electrical insulating material being provided intermediate the Vcc line and the pull-down gate, the insulating material comprising an opening extending substantially vertically from the Vcc line to the pull-down gate, the insulating material comprising at least two different insulating layers, a first of the insulating layers comprising a thickness that extends between the pulldown gate and the Vcc line, a second of the insulating layers lining an entirety of an internal periphery of the opening; and
the pull-up resistor being within the opening and extending substantially vertically between the Vcc line and the pull-down gate.

5. The SRAM cell of claim 4 wherein the pull-down gate has a top surface, and further comprising:
the pull-up resistor being against the top surface of the pull down gate;
the pull-down gate top surface comprising a first lateral width and the pull-up resistor comprising a second lateral width at a location where the pullup up resistor is against the pull-down gate top surface; and
the second lateral width being less than the first lateral width.

6. The SRAM cell of claim 5 wherein the pull-up resistor has a vertical length and comprises the second lateral width along an entirety of its length.

7. The SRAM cell of claim 4 wherein the first of the insulating layers comprises BPSG and the second of the insulating layers comprises $SiO_2$ and is not doped with boron or phosphorus.

8. The SRAM cell of claim 4 wherein the pull-up resistor has a cross-sectional width which is less than the minimum capable photolithographic feature dimension at the time the cell was fabricated.

9. The SRAM cell of claim 4 wherein the pull-up resistor comprises a diode construction.

10. The SRAM cell of claim 4 wherein the pull-up resistor comprises a back-to-back diode construction.

11. An SRAM cell comprising:
at least one pull-down gate, a ground line, a Vcc line, and at least one pull-up resistor; the pull-down gate having associated transistor diffusion regions operatively adjacent thereto, the pull-down gate comprising a top surface;
the Vcc line being elevationally outward relative to the transistor diffusion regions, an electrical insulating layer being intermediate the Vcc line and transistor diffusion regions; and
the pull-up resistor being substantially vertically elongated between Vcc and a selected of the transistor diffusion regions adjacent the pull-down gate through a substantially vertically elongated passageway formed through the insulating layer, the pull-up resistor contacting the top surface of the pulldown gate, the passageway comprising a combination of a contact opening through the insulating layer and an electrically insulating annulus spacer received within the contact opening.

12. The SRAM cell of claim 11 wherein the pull-up resistor has a cross-sectional width which is less than the minimum capable photolithographic feature dimension at the time the cell was fabricated.

13. The SRAM cell of claim 11 wherein the pull-up resistor comprises a diode construction.

14. The SRAM cell of claim 11 wherein the pull-up resistor comprises a back-to-back diode construction.

15. The SRAM cell of claim 11 wherein the electrical insulating layer and the annulus spacer are different in predominant composition.

16. The SRAM cell of claim 11 wherein the electrical insulating layer and the annulus spacer are the same in predominant composition.

17. The SRAM cell of claim 11 wherein the electrical insulating layer comprises BPSG and the annulus spacer comprises an insulating material which is not doped with boron or phosphorus.

18. The SRAM cell of claim 11 wherein the electrical insulating layer comprises BPSG and the annulus spacer comprises undoped $SiO_2$ deposited by decomposition of TEOS.

19. The SRAM cell of claim 11 wherein the electrical insulating layer and the annulus spacer are different in predominant composition; and
the pull-up resistor comprises a diode construction.

20. The SRAM cell of claim 11 wherein the electrical insulating layer and the annulus spacer are different in predominant composition; and
the pull-up resistor comprises a back-to-back diode construction.

21. The SRAM cell of claim 11 wherein the electrical insulating layer predominantly comprises BPSG and the annulus spacer predominantly comprises an insulating material which is not doped with boron or phosphorus; and
the pull-up resistor comprises a diode construction.

22. The SRAM cell of claim 11 wherein the electrical insulating layer predominantly comprises BPSG and the annulus spacer predominantly comprises an insulating material which is not doped with boron or phosphorus; and
the pull-up resistor comprises a back-to-back diode construction.

* * * * *

UNITED STATES PATENT AND TRADEMARK OFFICE
CERTIFICATE OF CORRECTION

PATENT NO.    : 5,939,760
DATED         : August 17, 1999
INVENTOR(S)   : Shubneesh Batra et al.

It is certified that error appears in the above-identified patent and that said Letters Patent is hereby corrected as shown below:

Col. 1, l. 8:    Replace "Jun. 3, 1997" with --Jan. 3, 1997--

Signed and Sealed this

Eighteenth Day of January, 2000

Attest:

Q. TODD DICKINSON

Attesting Officer    Commissioner of Patents and Trademarks

UNITED STATES PATENT AND TRADEMARK OFFICE
CERTIFICATE OF CORRECTION

PATENT NO.   : 5,939,760
DATED        : August 17, 1999
INVENTOR(S)  : Shubneesh Batra et al.

Page 1 of 1

It is certified that error appears in the above-identified patent and that said Letters Patent is hereby corrected as shown below:

Column 1,
Line 7, add the following:

-- GOVERNMENT RIGHTS

This invention was made with the United States Government support under contract No.: MDA972-92-C-0054 awarded by the Advanced Research Projects Agency (ARPA). The United States Government has certain rights in this invention. --

Signed and Sealed this

Eighteenth Day of December, 2001

Attest:

JAMES E. ROGAN
*Director of the United States Patent and Trademark Office*

*Attesting Officer*